(12) United States Patent
Green et al.

(10) Patent No.: US 6,639,428 B2
(45) Date of Patent: Oct. 28, 2003

(54) METHOD AND SYSTEM FOR DYNAMICALLY CLOCKING DIGITAL SYSTEMS BASED ON POWER USAGE

(75) Inventors: Andy Green, Northants (GB); Philip C. Barnett, Clanfield (GB)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/027,665

(22) Filed: Dec. 20, 2001

(65) Prior Publication Data

US 2003/0117175 A1 Jun. 26, 2003

(51) Int. Cl.[7] ............................. G06F 1/32; G06F 11/30
(52) U.S. Cl. ............................................ 326/93; 713/322
(58) Field of Search ............................. 326/93, 82, 62; 713/322, 323, 324

(56) References Cited

U.S. PATENT DOCUMENTS 5,761,517 A * 6/1998 Durham et al. ........ 395/750.04

* cited by examiner

Primary Examiner—Daniel Chang
(74) Attorney, Agent, or Firm—Margaret Chappuis; Steven J. Hultquist; William F. Ryann

(57) ABSTRACT

A digital circuit run in conjunction with a system clock signal. The digital circuit includes: a digital logic circuitry regulated by a clock signal and powered by a system current; and a clocking circuitry, communicatively coupled to the digital logic circuitry and the system clock signal, for supplying the clock signal to the digital logic circuitry. The clocking circuitry includes: a power supply monitor circuitry, communicatively coupled to the power supply, providing a first signal indicative of a predetermined level of system current; and a clock regulation circuitry, communicatively coupled to the power supply circuitry, which outputs the clock signal to the digital logic circuitry in response to the first signal. The clock signal comprises (1) the system clock signal when the first signal is in a first state, and (2) a modified clock signal when the first signal is in a second state.

38 Claims, 11 Drawing Sheets

METHOD AND SYSTEM FOR DYNAMICALLY CLOCKING DIGITAL SYSTEMS BASED ON POWER USAGE

BACKGROUND

1. Field of the Invention

The current invention is directed to a system and method for clocking a digital system. In particular, the current invention is directed to a dynamically adaptable clocking system and method based on power levels to the system.

2. Description of the Art

Many constraints of typical digital systems may be traced to power usage. Generally speaking, power usage and peak power usage is of great importance in digital systems. These systems, including chips, devices on a chip, boards, such as graphics adapters, network interfaces, input/output devices, and complex digital systems, including personal digital assistants, palm devices, smart cards, notebook computers, and desktop computers, to name a few, use an electric current to power their systems. Typically, these digital devices use clocked semiconductor circuits in their processing flow.

As such, these synchronous digital systems expend the bulk of their power consumption when the clock signal changes state. This is even more critical in smaller systems, since the bulk of the power is provided through battery power. As such, the power budget for these smaller systems is smaller than one for a typical larger system. Even so, all of the systems have a maximum power budget to expend per clock cycle.

Many typical systems attempt to control the outflow of the power by limiting the number of clocks a circuit might see. Typically, this is accomplished by a clock division process. A hard ratio of clock division is designed in the circuitry. In particular, this is usually accomplished by dividing the clock into some fraction or ratio less than the original system clock. In this process, all the clocks may be seen, for full power, one of every two clocks may be seen, for half power, and so on. Typically, this is accomplished by simply estimating the number of cycles that the circuit should see, and manually implementing a hard-designed clock divisor into the circuitry.

In many typical processor-based systems, a further complication is added. This is because the current consumption is in control of the software running on the device.

In many typical applications running on such a processor, the programmer hard codes a specific clock division ratio consistent with the power budget of the system during specific instances of code execution. However, this is not optimal, since the ratio is constant across all circuitries. There is no easy ability to target individual circuitries in order to either mask clocks, or slow down clocks. Additionally, there is no easy way to target the subsystems based on the level of processing that they may be presently be employed to execute.

Assume that a typical system has three sets of logical circuitries, A, B, and C. In a first state, circuitry A runs at full speed while circuitries B and C are idle. If the clock division ratio is constant across the circuitries, the clocks available to the circuitries are wasted in this state, since the circuitries B and C need not run at full throttle in this state.

Additionally, assume that in state two, it does not matter that circuit B runs at full throttle, but it would be nice, but not essential, that it does so. If the power available to the entire system runs near a maximum power budget, it would not be beneficial for circuit B to run at full throttle when the other systems are enabled.

In other words, many typical systems have a set clocking speed. This speed ensures that the power draw at the peak computation does not exceed the operating budget. Thus, when the circuit is operating less intensely, it could go faster without breaching the power budget.

Changing the clock division ratio in software is not easily accomplished. In practice, this takes a good amount of extra code, effort, and verification that the budget is not exceeded. Additionally, when new chip sets are employed, their power signatures may not match those expected by the code designers. In this case, the dynamic software clocking does not meet the physical parameters of the new system, and the software is thus made obsolete.

In this manner, the typical clocking systems and methods suffer one or more shortcomings. Many other problems and disadvantages of the prior art will become apparent to one skilled in the art after comparing such prior art with the present invention as described herein.

SUMMARY

Aspects of the invention are found in a digital circuit having a regulated clock. The digital circuit is run in conjunction with a system clock signal. The digital circuit includes a digital logic circuitry that is regulated by a clock signal and powered by a system current.

The digital circuit also includes a clocking circuitry communicatively coupled to the digital logic circuitry. The system clock signal may also be supplied to the clocking circuitry. The clocking circuitry supplies a regulated clock signal to the digital logic circuitry.

The clocking circuitry includes a power supply monitor circuitry. The power monitor circuitry is coupled to the power supply and provides a signal indicative of the current or power consumed by the system.

The clocking circuitry also has a clock regulation circuitry. The clock regulation circuitry is coupled to the power supply monitoring circuitry and outputs a clock signal to the digital logic circuitry. The particular clock signal is based upon the signal indicative of system current.

More particularly, the particular clock signal is the system clock signal when the signal indicative of system current is in a first state. When the signal indicative of system current is in another state, a different modified clock signal is provided to the attached digital logic circuitry.

Additional aspects of the invention are found in such a digital circuit containing modal circuitry. The modal circuitry affects the clock output based upon the state reflected in the modal circuitry. As such, it may inhibit the changed clock, or override a default clock. The modal circuitry may be used in logical combinations with the signal indicative of system current to define differing clock states.

In one aspect, the trigger to effect the clock change is the comparison of the signal indicative of system current to a predetermined level of system current. In some cases, this predetermined level may be dynamically adaptable.

In other aspects of the invention, the power supply monitor circuitry may be made with a programmable current sink. In this manner, the current monitoring may be dynamically altered.

The power supply monitor circuitry may contain a voltage comparator. The voltage comparator can compare a voltage indicative of the system current and a first predetermined voltage. The power supply monitor circuitry can further contain a second voltage comparator. The second voltage comparator compares the voltage indicative of the system current to a second predetermined voltage.

In addition, the power supply monitor circuitry may have an analog to digital converter. The analog to digital converter produces signals on a plurality of output lines, where the signals on the plurality of output lines are indicative of the system current level.

The clock regulation circuitry may contain a clock inhibiting circuitry. The clock inhibiting circuitry prevents the assertion of a clock signal to the attached digital circuitry when the power usage for the system is too high.

The clock regulation circuitry may also be a clock reduction circuitry. In this case, the clock reduction circuitry outputs a second clock signal to the attached digital circuitry when power usage is too high. In this case, the second clock signal is slower than the system clock signal. This can be adaptively clocked accomplished with a clock divider.

Other aspects of the invention are found in a digital system with an adaptively regulated clocking cycle. The system is powered by a system current. The digital system has a system clock signal.

The digital system can contain a first logic circuitry clocked by a first clock signal and a second logic circuitry clocked by a second clock signal. The first and second logic circuitries are powered by the system current.

The system can contain an adaptive clocking circuit, communicatively coupled to the first logic circuitry. The adaptively clocked circuit is also coupled to the system current, and possibly to the system clock. The adaptive clocking circuit supplies the first clock signal to the first logic circuitry.

The first clock signal is the system clock signal when the current consumed by the system is below a predetermined threshold. Otherwise, the first clock signal is another clock signal when the current consumed by the system is above the predetermined threshold.

The adaptive clocking circuit can contain a system current monitoring circuitry. This system current monitoring circuitry produces a signal indicative of the current consumed by the system. Or, it can produce a signal indicative when the current is above or below a predetermined threshold.

In one aspect, the system current monitoring circuitry has an integrating capacitor. The voltage on the capacitor is indicative of the current flowing, or of a proportion of the system current.

The current monitoring circuitry may be programmable. This may take the form of a programmable current sink. Alternatively, it may take the form of a variable voltage comparator. Alternatively, it may take the form of an analog to digital converter.

The adaptive clocking circuit can have a clock generating circuitry. In one case, the clock generator is coupled to the system clock. The clock generator produces a clock signal based on the signal indicative of the current consumed by the system.

In one implementation, the produced clock signal inhibits the operation of the first logic circuitry. In another, the produced clock signal operates at a slower speed than the system clock signal. Or, two levels can produce two results. The first level may result in the clock signal being slowed. The second level may result in the clock being slowed further, or the clock being masked.

Such an adaptive clocking circuitry can be made of a flip-flop and/or combinatorial logic. Other adaptations of adaptive clocking can implement a clock divider.

Other aspects of the invention are found in a method of altering a clock signal to a digital circuitry in a system based upon a current supplied to the system. Again, the system runs on a system clock.

The method includes the steps of monitoring the current against a first predetermined current level. Then, the method selectively clocks the digital circuitry based on the current. The step of selectively clocking is made of two parts. First, a step of generating a first clock if the step of monitoring indicates that the current is below the first predetermined level. Otherwise a step of generating a second clock if the step of monitoring indicates that the current is above the first predetermined level is performed.

Other aspects of the method are found when the system dynamically adapts the predetermined level. The step of dynamically adapting can be performed, at least in part, by a circuit comprising a current sink.

The step of monitoring can be performed by a circuit having a capacitor. The step of monitoring can also be performed by a circuit having a voltage comparator.

In one aspect of the method, the step of generating a second clock includes inhibiting the clock to the digital circuitry. Or, the generated clock can be the system clock.

In an aspect of the invention, the step of monitoring includes monitoring the current to exceed a second predetermined current. In this case, the step of selectively clocking further includes generating a third clock if the step of monitoring indicates that the current is above the second predetermined level.

Various clock signals can be generated in aspects of the invention. The first clock can be the system clock. The second clock can be slower than the system clock.

It should be noted, that while the embodiment describes a system and method for adaptively timing digital systems, it is readily adaptable to all types of clocked circuits and systems. As such, the application should be construed as covering those as well. Other aspects, advantages, and novel features of the present invention will become apparent from the detailed description of the invention when considered in conjunction with the accompanying drawings.

DETAILED DESCRIPTION OF THE PREFERRED EMBODIMENT

Aspects of the current invention are drawn to a system that monitors the current being drawn from a circuit or groups of circuits. Based upon the current draw of the system, an adaptable clocking circuitry regulates the clocking signals to an attached digital circuitry. In this manner, single circuits, or groups of circuits, may be adaptively clocked.

The adaptive clocking may be accomplished through inhibiting clocking signals, or through adaptively slowing them, or some combination thereof. Additionally, the trigger level may be adaptively controlled through high-level intervention such as a processor, controller, or other digital signal. Additionally, a system mode signal may used in conjunction with the power levels to adaptively regulate the clock signal to any individual circuit or digital system, or any groups of circuits or systems.

Figure 1:
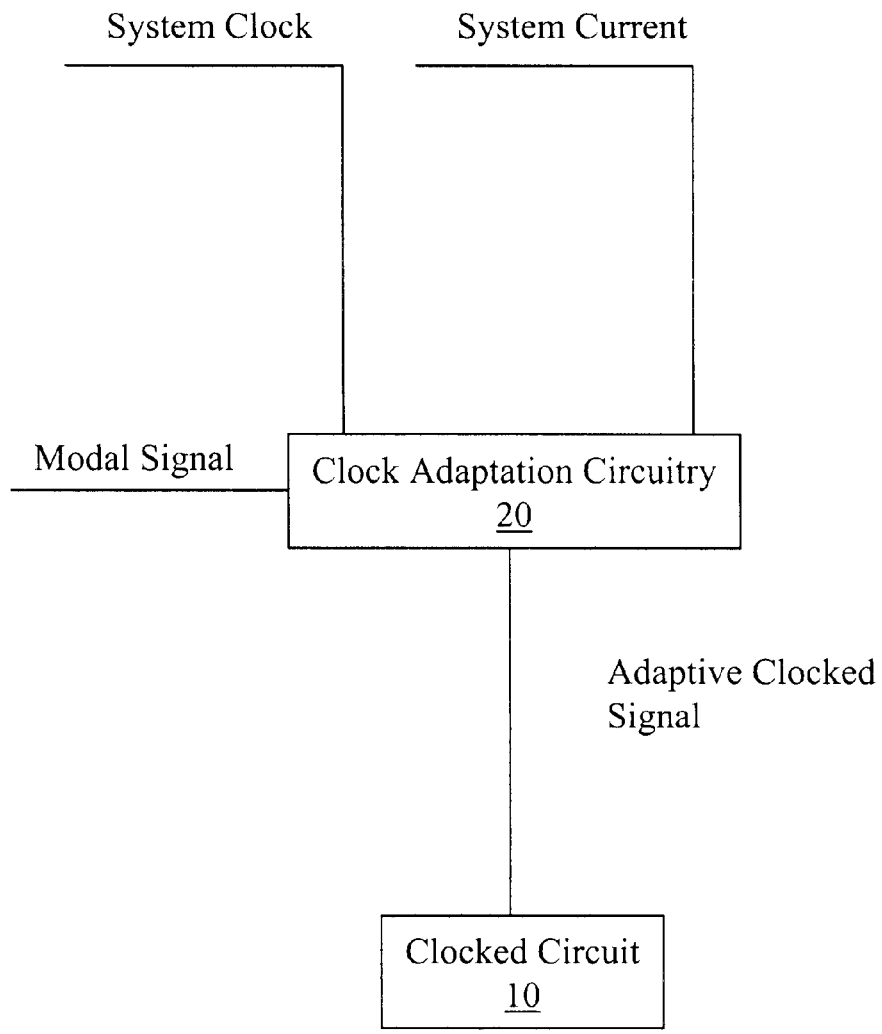
FIG. 1 is a schematic block diagram of an adaptively dynamically clocked digital circuitry system according to the invention.

FIG. 1 is a schematic block diagram of an adaptively clocked digital circuitry system according to the invention. An adaptive clocking mechanism can be manufactured on a chip containing logic circuits, controllers, or programmable processors that require a clock. Such a chip may be a digital system, or several chips may be combined in a digital system such as a computer, hand-held digital device, smart card, or any other digitally operated system. Each of the extraneous logical functions is adaptively clocked. When the other portions of the system are in use, the power used by the complete system may go higher than the power consumption constraints allow. The drawn power problem is compounded when the system is powered by an electric battery. In this case, the maximum allowable power drawn on clock cycles may be far less than maximum allowable power levels seen when powered by conventional wall powered units.

The system contains a logic unit 10. The logic unit may be any digital circuitry requiring or using a clock signal. Or, it may be any digital circuitry in which the input is a clock.

The logic unit 10 provides logical functions to a system. In this case, when the system is running at a lower computational rate, the system can run at a high clock rate without breaching the total current or power consumption budget. When the overall power to the system reaches a high level, the logic unit 10 can go into a slower mode, to conserve power or current draw during high usage times.

To accomplish this by adaptive clocking, an adaptable clocking circuitry 20 is provided. The adaptively clocked circuit 20 monitors the total system current. The fast system clock is also input to the adaptively clocked circuit 20. When the system current reaches a threshold, the clock is adaptively slowed to the logic unit 10. In this manner, active power conservation is achieved for the system by selectively regulating the clock speed of the logic unit 10.

For example, assume that the system is operating at a power load less than the maximum output. In this case, the adaptively clocked circuit determines that the steady current to the system allows for the full clocking of the logic unit 10. In this case, assume that the clock speed is set to 500 Mhz. In the steady state of the system, the full clock cycle of 500 Mhz would be delivered to the logic unit 10. However, assume that, for some reason, the system current exceeds a preset threshold. In this case, the adaptively clocked circuit 20 would limit the clock cycles to the logic unit 10.

Additionally, the adaptively clocked circuit 20 may be used in conjunction with modal circuitry to selectively screen circuitry based on priority as well as power consumption. In this manner, the adaptively clocked circuit may determine that the power load exceeds a threshold making the limiting of power necessary. The adaptively clocked circuit would then initially limit the clock cycles to the logic unit 10.

However, the mode of the actual circuitry may such that the circuitry may need to be run at the absolutely fastest speed. The adaptively clocked circuit 20 may then reset the clock signal to the fastest speed possible.

As such, the adaptively clocked circuit 20 may deterministically decide two threshold states for the clock to be limited to the circuitry. First, the power level of the actual system may be utilized to limit the clock cycles. Then, priority levels may be set in the circuitry to override the limitation, resulting in a resumption of the fastest clock cycle. As such, clock cycles can be adaptively set for multiple groups of circuits depending on power and on state.

All the logic circuits on a single chip may be regulated by a single adaptively clocked circuit. Alternatively, select circuitry on the chip may be regulated by the adaptively clocked circuit.

Or, in a complex system, such as a notebook computer, several bus attachments, such as a graphics adapter or input device such as a keyboard, may be regulated by such an adaptively clocked circuit. Individual chips on individual cards may be regulated by a single adaptively clocked circuit, or several chips on a single card may also be regulated by such an adaptively clocked circuit.

Figure 2:
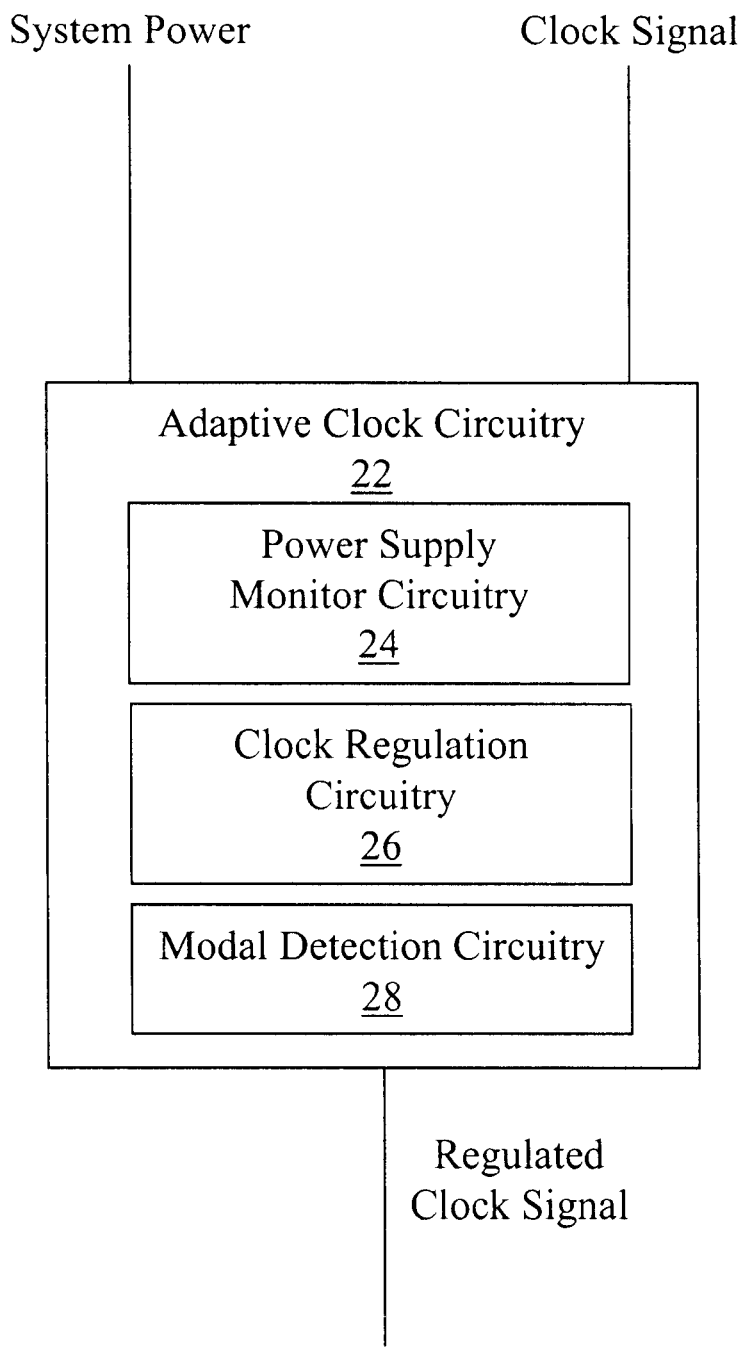
FIG. 2 is a block level diagram of an aspect of the adaptively clocked circuit of FIG. 1.

FIG. 2 is a block level diagram of an aspect of the adaptively clocked circuit of FIG. 1. In this aspect, the adaptively clocked circuit 22 is coupled to the system power supply. The adaptively clocked circuit 22 contains a system power monitor 24, a clock regulator 26, and an optional modal circuitry 28. When the system power supply is at or above a threshold value, the adaptively clocked circuit 22 determines that this state exists through the power monitor 24.

The power monitor 24 compares the present power supply characteristics to a threshold. When the threshold is met or exceeded, the clock regulator or clock generator 26 then limits the outgoing clock to the attached digital circuitry, As such, the adaptively clocked circuit 22 regulates the current consumed by the attached logic circuitry based on the system power or current consumption characteristics.

In one case, the clock regulator 26 will suppress the clock signal. In this case, the clock regulator 26 actively inhibits any clock signal to the attached logical circuitry. Only when the indication from the power monitor 24 indicates that the power supply to the system has fallen below a threshold will clock cycles be relayed to the rest of the attached digital logic.

Or, the clock regulator can slow the clock signal. In this case, when the power monitor indicates the power to the system has exceeded a threshold, it may latch the incoming clock to a clock division circuitry. In this manner, the clock is slowed by a predetermined amount.

When the power supply has fallen below the upper limits, the clock divisor may be deactivated, resulting in the resumption of the unregulated clock to the attached digital circuitry. As such, clock cycles to the attached circuitry may be "dropped" as long as the power levels exceed a threshold, or they may be limited by some sort of clock division circuitry.

Accordingly, many types of clock division schemes may be envisioned or directly designed. Many ratios can be effected, and can be designed into the circuit.

In one case, the power monitor 24 not only indicates that the power level has been exceeded, but may indicate by how much the level has been exceeded. For example, assume that the power monitor 24 indicates that the system current level, which triggers a slowdown, has been exceeded by a certain level.

The power monitor 24 reports to the adaptively clocked circuit 26 not only the fact that the current level has exceeded the upper limit, but may indicate by how much. In this case, the adaptively clocked circuit 26 will take appropriate action based on by how much the level has been exceeded.

The adaptively clocked circuit may transform the clocking from a 1:1 ratio into a 3:2 ratio when one level is indicated. If a higher level is indicated, it may dynamically increase the ratio to 2:1, and so on. If a still higher level is indicated, the full inhibition of the clocking may take place.

Possibly present on or about the adaptively clocked circuit 22 is a modal circuitry. This modal circuitry may be used to change or override the inhibition or reduction circuitry. In the simplest case, the modal circuitry may be a signal line from some portion of the entire system indicating that the logic of the attached circuitry is critical to the ongoing functionality. When this happens, the modal circuitry may be used to override the inhibition signal that may be generated.

As an example, the power monitor 24 may indicate that the level of current to the entire system is at or beyond a predetermined level. In this case, the power monitor would indicate to the adaptively clocked circuit 26 to divide or inhibit the clock to the circuitry.

If the modal circuitry indicates that the functionality of the attached digital circuitry is essential to the process, the combination of the signal from the power monitor 24 and the modal circuitry 28 may be logically combined together. In this manner, the clock mode of the circuitry functionality may be kept at a certain level.

In this case, the modal circuitry is used to override the inhibition or reduction of the clock cycles. The mode may be used in multistate power determination to enhance or decrease the level at which the clocking regulation occurs. As such, the mode may be used to override, enhance, or diminish the adaptive clocking features.

Figure 3:
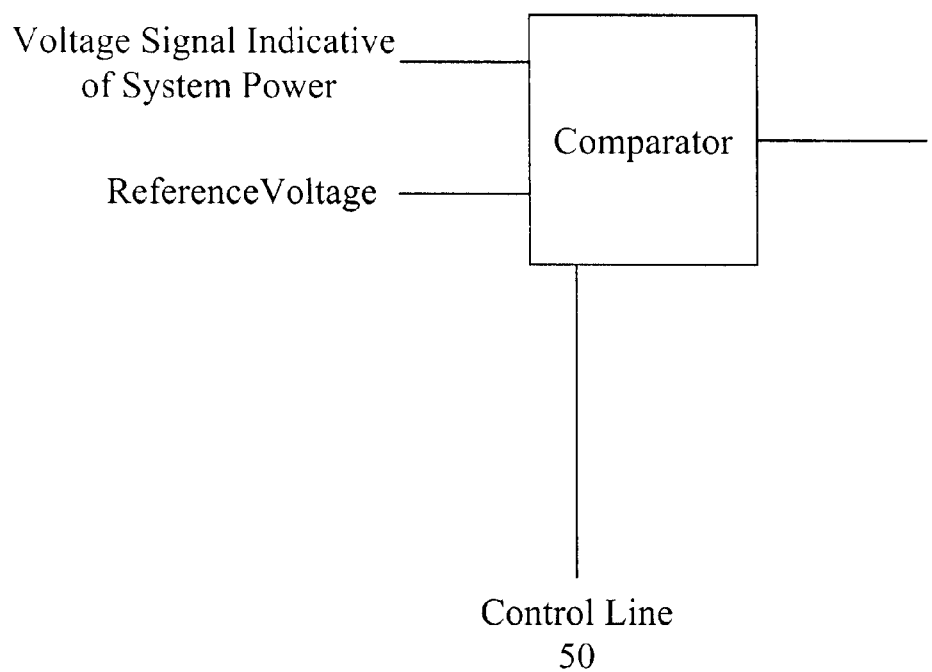
FIG. 3 is a schematic diagram of an exemplary aspect of a power monitor circuitry of FIG. 2.

FIG. 3 is a schematic diagram of an exemplary aspect of a power monitor circuitry of FIG. 2. In this case, the power monitor circuitry is a simple comparator. A digital representation of the entire system circuitry is derived and input into a comparator circuitry. A predetermined level is the second input to the comparator circuitry. When the first level is higher than the fixed reference voltage, the comparator outputs a signal indicative of this. In this manner, the output signal may be used to directly inhibit the output clock to the attached digital circuitry. Or, the output may be used to initiate a clock divisor circuitry.

Figure 4:
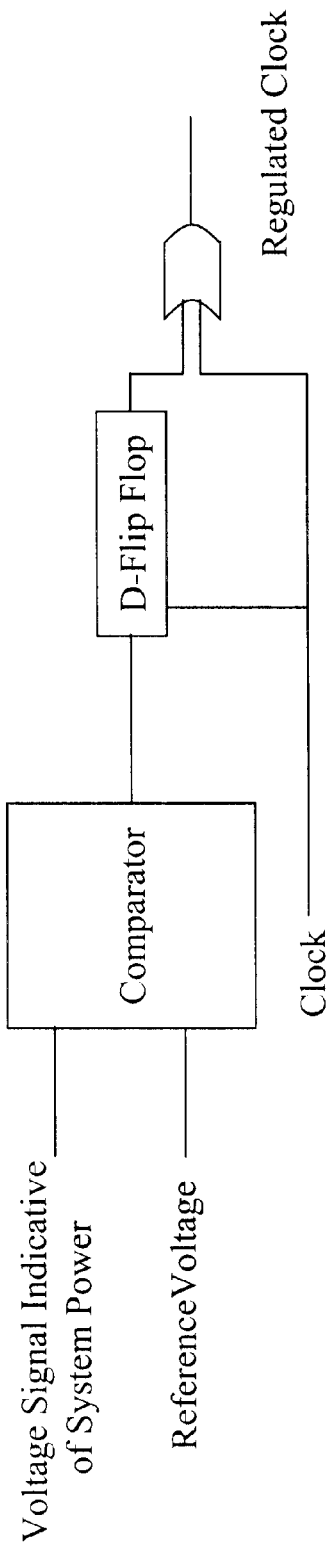
FIG. 4 is a schematic diagram of a possible implementation of a power monitor adaptively clocked according to FIG. 3 working in conjunction with an inhibition circuitry.

FIG. 4 is a schematic diagram of a possible implementation of a power monitor according to FIG. 3 working in conjunction with an inhibition circuitry. In this case, the power monitor has indicated that the threshold level has been exceeded. The output of the comparator is latched into a D flip-flop. The other input to the D flip-flop is the regular clock. The output of the flip-flop is ORed with the clock itself.

When the power level has not exceeded the preset maximum, the output of the comparator is low, and the output of the D flip-flop is low. As such, in the normal state, the output of the OR gate is simply the clock itself.

However, when the level of the input to the comparator exceeds the fixed level, the comparator goes high. When the D flip-flop is clocked, the flip-flop will also go high. When this happens, the output of the OR gate goes high. The output of the OR gate will remain high for as long as the level coming into the comparator remains above the threshold. As such, the output clock is inhibited completely until the current level goes low.

The usage of the D flip-flop may preserve the clocking characteristics of the digital circuitry. In this manner, the edges of the clock are maintained in a synchronous manner. However, when synchronous edges are not needed, the output of the comparator may be directly ORed with the system clock.

Figure 5:
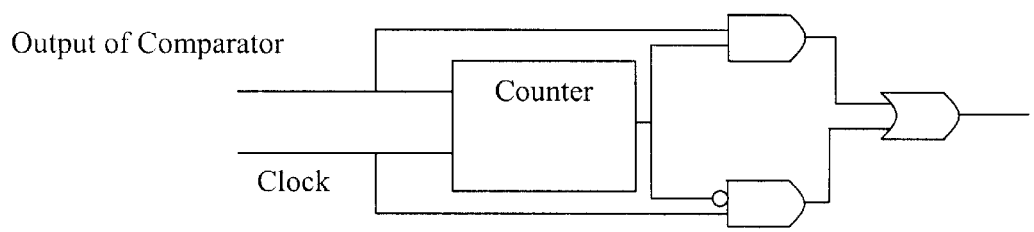
FIG. 5 is a schematic diagram of a possible implementation of a power monitor according to FIG. 3 that may be used to reduce, but not inhibit, the clocking signal to the attached digital circuitry.

FIG. 5 is a schematic diagram of a possible implementation of a power monitor according to FIG. 3 that may be used to reduce, but not inhibit, the closing signal to the attached digital circuitry. In this case, the power monitor takes the form as in the previous figure.

The output of the comparator goes to an input of a counter. The other input of the counter is the system clock. When the comparator output is high, the counter is enabled. The output of the counter is a fixed ratio of the input clock. The output of the counter, or the "slowed" clock, is ANDed with the output of the comparator. As such, the "slowed" clock is present on the output when the comparator is enabled, and a logical zero is on the output when the comparator is disabled.

The inverse of the comparator is also ANDed with the normal system clock. In this case, the output on this portion of the circuitry is a logical zero when the comparator is asserted and the normal system clock when the comparator is deasserted. The two ouputs of the AND gates are ORed together. Thus, when the comparator goes high, the output is a reduced clock. When the comparator indicates a state that allows the full clocking of the attached digital circuitry, the output is the normal clock.

Figure 6:
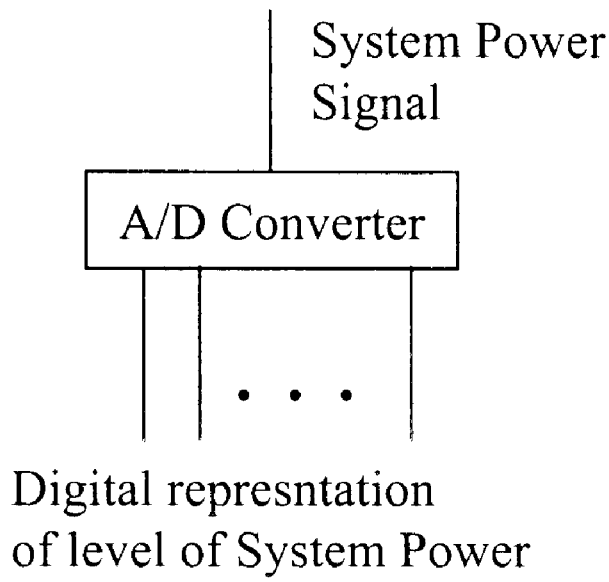
FIG. 6 is a schematic diagram of a possible power monitor circuitry that indicates how the supply may be monitored for differing levels in FIG. 2.

FIG. 6 is a schematic diagram of a possible power monitor circuitry that indicates how the supply may be monitored for differing levels in FIG. 2. In this case, the power level indication is fed directly into an analog to digital converter. The one analog input goes into the converter having multiple output lines. The level of the power supply is then converted into a digital representation. These output lines may be used in conjunction with one another to activate the differing responses to the differing power levels.

Figure 7:
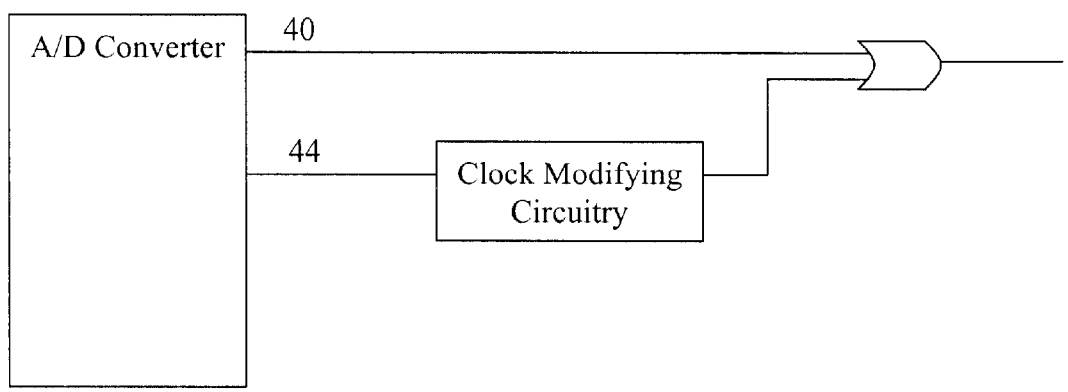
FIG. 7 is schematic diagram of implementation of differing clock response to differing power levels, using the power monitor circuitry of FIG. 6.

FIG. 7 is schematic diagram of implementation of differing clock response to differing power levels, using the power monitor circuitry of FIG. 6. In this case, assume that the power level produces an indication on the line 40, indicative of the highest order bit on the converter. In this case, the assertion of this line is fed into an OR gate.

At the other input, the OR gate has a modified clock, which will be described below. However, when the line 40 is asserted, the output of the OR gate is an inhibition of the clocking functionality to the attached digital circuitry until the output of the line goes down.

When the output of the line 40 is low, the output of the OR gate is the modified clock signal emanating from clock modifying circuitry 42. Thus, when the high order bit is deasserted, the output of the OR gate to the attached circuitry is the modified clock signal emanating from clock modifying circuitry 42.

Clock modifying circuitry 42 is made in a manner and having similar functionality as that depicted in FIG. 5. In this manner, when a line 44, indicating the middle bit of the converter circuitry is asserted, the output of the clock modifying circuitry 42 is a slowed clock, such as that described in FIG. 5. When the line 44 is deasserted, the output of the clock modifying circuitry 42 is the normal system clock.

As such, when the first level is reached, the adaptively clocked circuit clocks the attached digital circuitry in a normal manner. However, when second level is reached, the adaptively clocked circuit clocks the attached digital circuitry in a slower manner.

When a higher level of system power or current consumption is reached, the adaptively clocked circuit inhibits all clocking to the attached digital circuitry. Of course, various logical combinations of the pins or circuitry associated with the various significant digits of the multilevel detection circuitry may be used in combination to produce various results.

Figure 8:
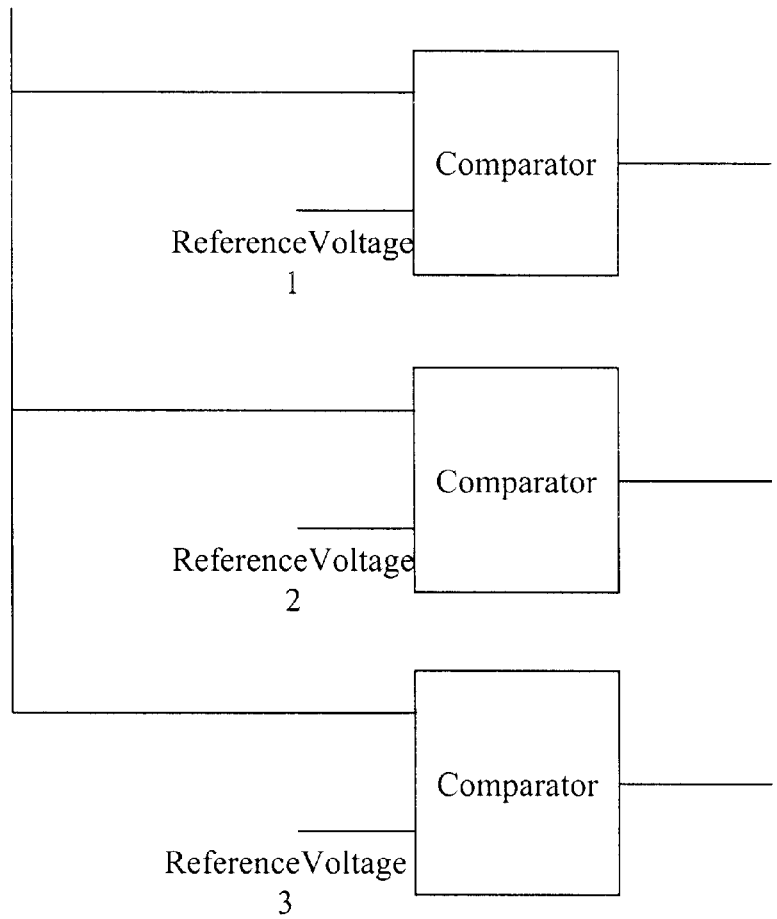
FIG. 8 is an alternative power monitor circuitry that may be used in the monitoring of different levels of system power or current consumption.

FIG. 8 is an alternative power monitor circuitry that may be used in the monitoring of different levels of system power or current consumption. In this case, three separate comparators are used. However, three differing reference voltages are used in each comparator. As such, the various consumption levels may be directly monitored in a static manner.

Figure 9:
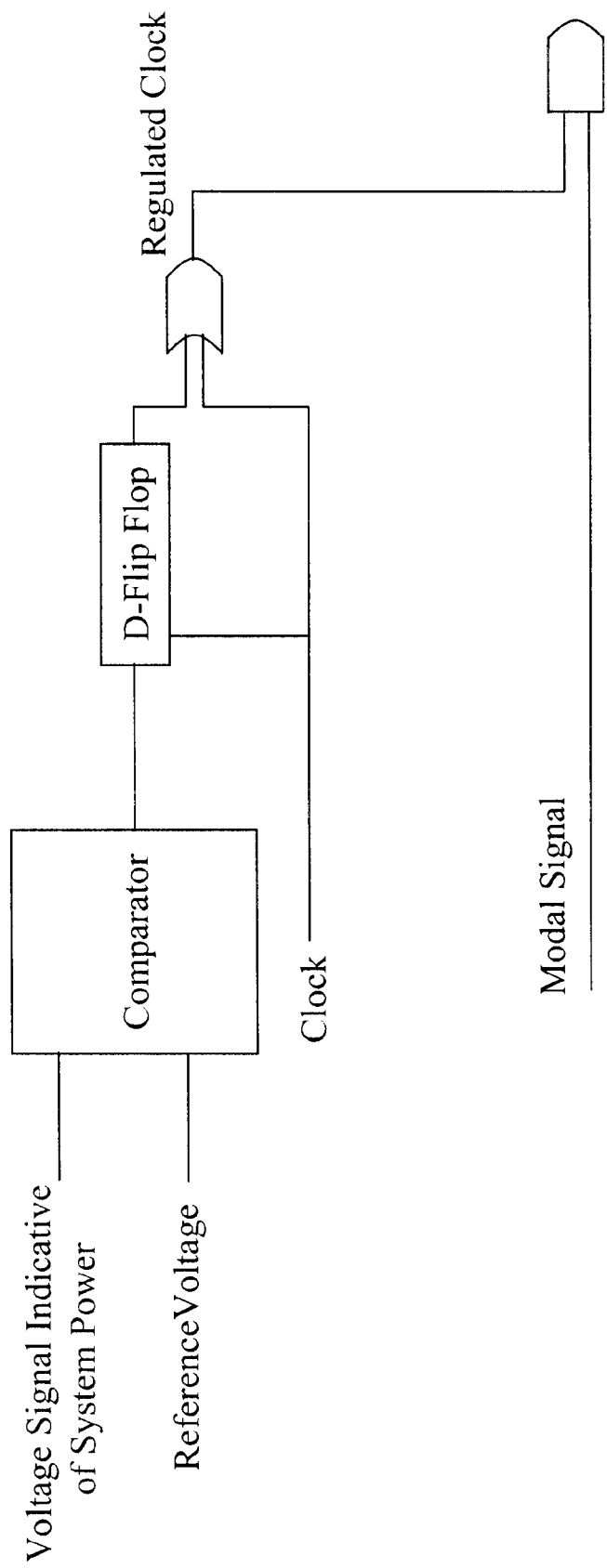
FIG. 9 is a schematic block diagram of the implementation of the modal circuitry in conjunction with the adaptively clocked circuit of FIG. 4.

FIG. 9 is a schematic block diagram of the implementation of the modal circuitry in conjunction with the adaptively clocked circuit of FIG. 4. In this manner, a mode indicator is used as an input to an AND gate. The other input to the AND gate is a signal indicating the status of the attached digital circuitry with respect to the processing state of the system.

If the modal signal is deasserted, then the output of the flip-flop is inhibited. As such, the overall inhibition signal may itself be inhibited based on the state of the system. Of course, such modal circuitry may be used in conjunction with those circuitries found throughout this specification. Such modal circuitry may be used to inhibit or restrict the "cloaking" of the system clock, or to restrict the "slowing" of the clock as well.

In one case, with the multiple clocking scheme of FIG. 7, the modal signal may be used to keep the slowing of the clock from happening, but the assertion of the inhibition signal may override the modal indication. Or, the modal indication may override all slowing and cloaking of the clocking signal. Of course, the modal signal may comprise various lines, indicating various levels of priority. In this manner, various combinatorial signals may be derive derived involving various stages of power level indicators along with modal indicators to produce a specific clocking outcome.

The levels at which events occur may also be dynamically altered. For example, in one case, the fixed reference voltages of FIGS. 3 and 8 may be variable reference voltage comparators. In this case, various control lines may be used to "set" the reference voltages at which events occur. For example, in FIG. 3, assume that the reference voltage is set a level A. When the control line 50 is asserted, the reference rises to a level B. Thus, the system can dynamically change the voltage giving rise to the "trigger" of the clock altering mechanisms. In one case, the modal circuitry may be used to set a higher threshold. This may occur with or without the combinatorial characteristics of the modal circuitry described above.

Figure 10:
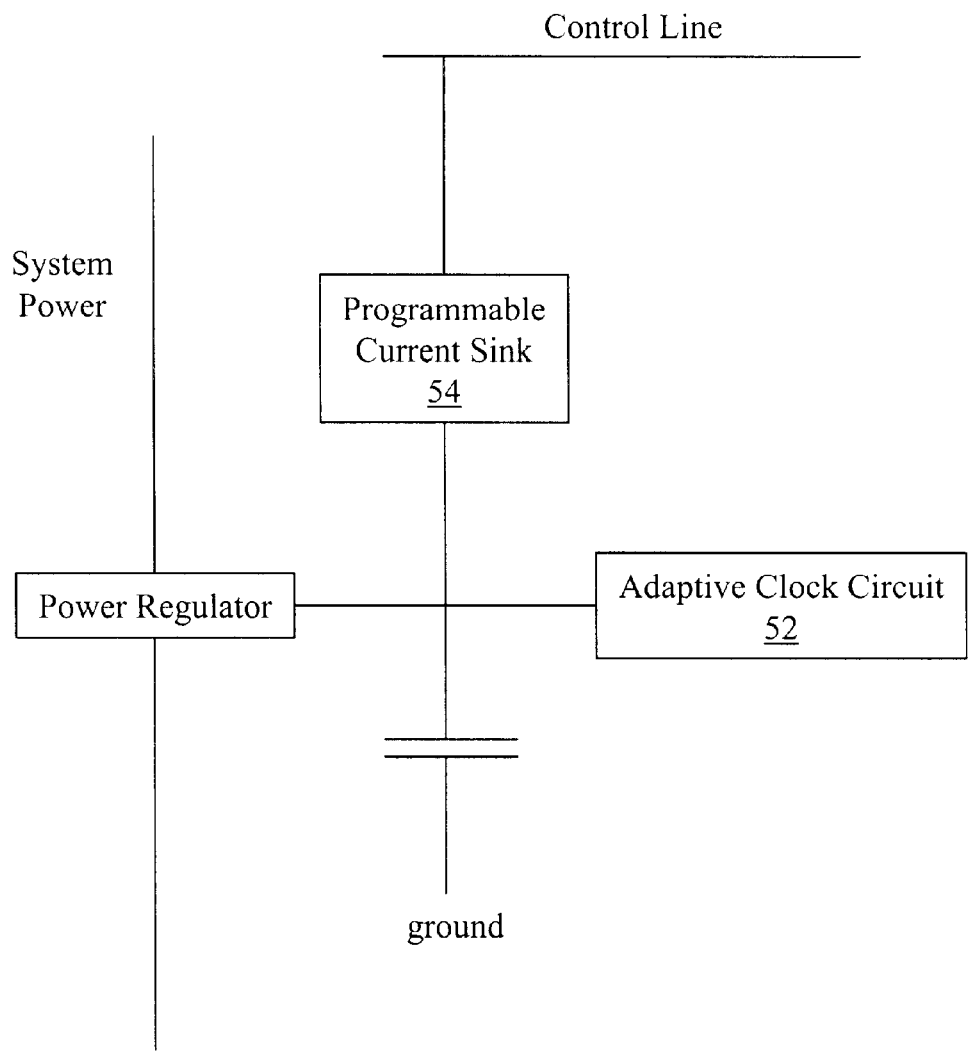
FIG. 10 is an exemplary aspect of a dynamic control circuit working in conjunction with an exemplary power monitor of FIG. 1.

FIG. 10 is an exemplary aspect of a dynamic control circuit working in conjunction with an exemplary power monitor of FIG. 1. In this case, the main system voltage regulator supplies a small current to the adaptively clocked circuit 52. This small current is proportional to the current being drawn by the internal power output of the regulator. This signal is fed to an integrating capacitor. As such, the integral of the current over time is the voltage measured at the capacitor. As such, the voltage at the capacitor is indicative of the amount of current being drawn by the internal power supply.

The voltage of this capacitor may serve as the reference in any of the exemplary aspects depicted in the preceding specification. In normal operation, assume that the reference level of the triggering mechanism or mechanisms is at a voltage level y, indicative of a current y' at the capacitor.

However, attached to the node of the capacitor is a programmable current sink 54. The programmable current sink 54 is in turn connected to a digital control signal. When the digital signal indicates one state, the programmable current sink will sink a set amount of current, x'. Thus, the total current into the attachment node between the programmable current sink 54 and the capacitor must be x'+y'. However the voltage of the capacitor indicates a current of y' when the sink is enabled. Thus, the trigger level of the system may be altered without altering the voltage comparison levels in the remainder of the adaptively clocked circuit.

As such, the adaptively clocked circuit may be tuned to actuate at various currents, depending on the sink capacity of the programmable current sink 54. In fact, the programmable current sink 54 may be coupled to control circuitry to actuate this programmable or dynamically alterable level.

Figure 11:
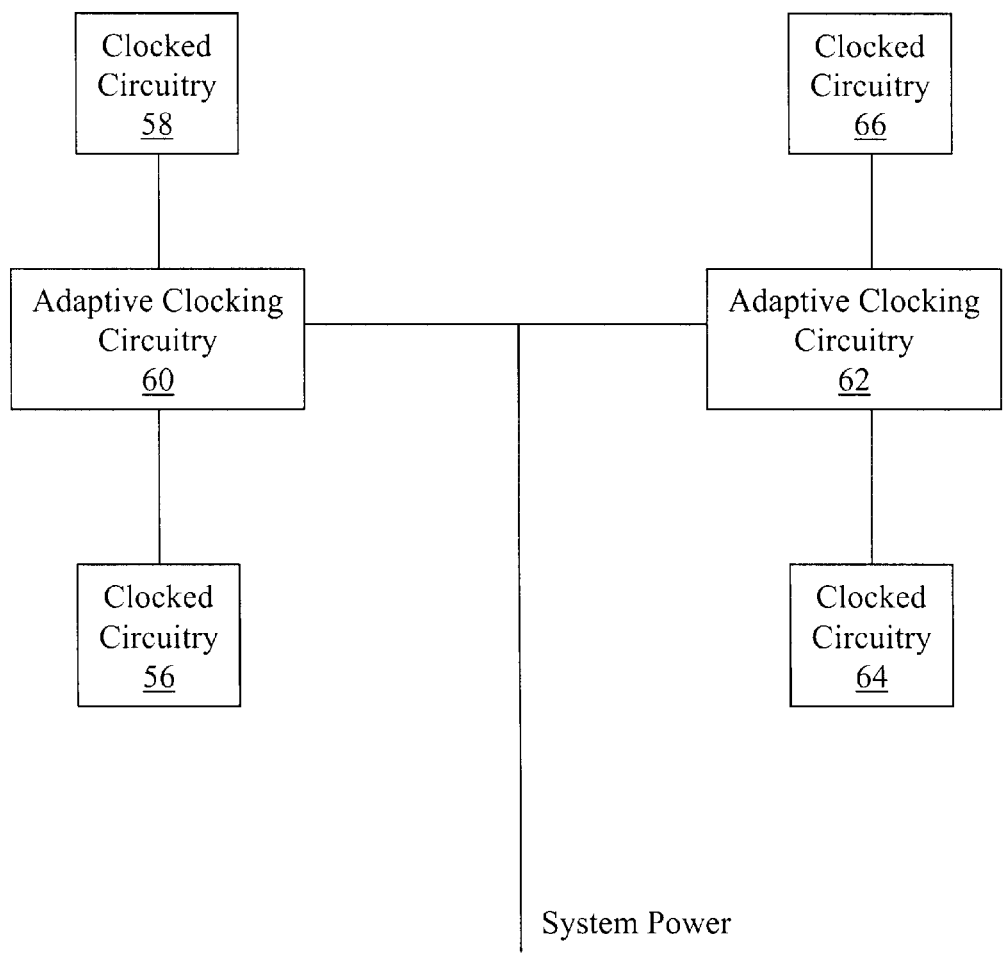
FIG. 11 is schematic block diagram indicating how the adaptively clocked circuit of the various figures may be used to actuate and dynamically speed up, slow down, or inhibit the clocking to various circuitries.

FIG. 11 is a schematic block diagram indicating how the adaptively clocked circuit of the various figures may be used to actuate and dynamically speed up, slow down, or inhibit the clocking to various circuitries. In this exemplary aspect, the digital circuitries 56 and 58 are relayed a clock signal from an adaptively clocked circuit 60. The digital circuitries 64 and 66 are relayed a clock signal derived from another adaptively clocked circuit 62. Thus, during certain power conditions, the digital circuitries may be slowed, stopped, or not affected at all. In one case the digital circuits 64 and 66 may operate at normal speeds while the digital circuits 56 and 58 are inhibited or slowed. Or, the digital circuits 64 and 66 may be slowed while the digital circuits 56 and 58 are inhibited.

Of course, each adaptively clocked circuit described previously may be used in this system. As such, a controller circuitry may dynamically alter the trigger consumption levels based on states of the other circuitries or other conditions external to the system.

It should be noted that the preceding diagrams might be joined and used with one another in many different combinations. This specification should be construed as describing the various combinations of power monitors, clock regulators, modal circuitry, and dynamic interaction between a system and the underlying functional units.

As such, a method and apparatus for adaptively and dynamically clocking digital circuits and systems are described. In view of the above detailed description of the present invention and associated drawings, other modifications and variations will now become apparent to those skilled in the art. It should also be apparent that such other modifications and variations may be effected without departing from the spirit and scope of the present invention as set forth in the claims which follow.

What is claimed is:

1. A digital circuit run in conjunction with a system clock signal, the digital circuit comprising:
    a digital logic circuitry regulated by a clock signal and powered by a system current;
    a clocking circuitry, communicatively coupled to the digital logic circuitry and the system clock signal, for supplying the clock signal to the digital logic circuitry, clocking circuitry comprising:
        a power supply monitor circuitry, communicatively coupled to the power supply, providing a signal indicative of current or power consumed by the system;
        a clock regulation circuitry, communicatively coupled to the power supply circuitry, that outputs the clock signal to the digital logic circuitry in response to the signal indicative of current or power consumed by the system;
        the clock signal comprising the system clock signal when the signal indicative of current or power consumed by the system is in a first state; and
        the clock signal comprising a modified clock signal when the signal indicative of current or power consumed by the system is in a second state;
    wherein the clock regulation circuitry is constructed and arranged to continuously vary the modified clock signal in accordance with the level of system current or power consumed by the digital logic circuitry in relation to the current or power consumed by the system while in the second state, and dynamically speed up or slow down the digital logic circuitry or inhibit clock rate so that the digital logic circuitry is run at a clock rate and computational rate that do not breach a total current or power consumption budget of the system.

2. The digital circuit of claim 1, the power supply monitor circuitry comprising a first voltage comparator, the first voltage comparator comparing a voltage indicative of the system current and a first predetermined voltage.

3. The digital circuit of claim 2, the power supply monitor circuitry further comprising a second voltage comparator, the second voltage comparator comparing a voltage indicative of the system current and a second predetermined voltage.

4. The digital circuit of claim 1, the power supply monitor circuitry comprising a analog to digital converter, the analog to digital converter producing signals on a plurality of output lines, the signals on the plurality of output lines indicative of the system current.

5. The digital circuit of claim 1, wherein the clock regulation circuitry does not include a clock divider.

6. The digital circuit of claim 1, wherein the clocking circuitry further comprises modal circuitry constructed and arranged to selectively override the clock signal output by the clock regulation circuitry to the digital logic circuitry, in accordance with at least one priority criterion.

7. A digital circuit of run in conjunction with a system clock signal, the digital circuit comprising:
    a digital logic circuitry regulated by a clock signal and powered by a system current;
    a clocking circuitry, communicatively coupled to the digital logic circuitry and the system clock signal, for supplying the clock signal to the digital logic circuitry, the clocking circuitry comprising:
        a power supply monitor circuitry, communicatively coupled to the power supply, providing a signal indicative of current or power consumed by the system;
        a clock regulation circuitry, communicatively coupled to the power supply circuitry, that outputs the clock signal to the digital logic circuitry in response to the signal indicative of current or power consumed by the system;
        the clock signal comprising the system clock signal when the signal indicative of current or power consumed by the system is in a first state;
        the clock signal comprising a modified clock signal when the signal indicative of current or power consumed by the system is in a second state; and
        a modal circuitry having an output,
    wherein the clock regulation circuitry alters the clock signal in response to a logical combination of (i) the signal indicative of current or power consumed by the system and (ii) the output of the modal circuitry.

8. A digital circuit run in conjunction with a system clock signal, the digital circuit comprising:
    a digital logic circuitry regulated by a clock signal and powered by a system current;
    a clocking circuitry, communicatively coupled to the digital logic circuitry and the system clock signal, for supplying the clock signal to the digital logic circuitry, the clocking circuitry comprising:
        a power supply monitor circuitry, communicatively coupled to the power supply, providing a signal indicative of current or power consumed by the system;
        a clock regulation circuitry, communicatively coupled to the power supply circuitry, that outputs the clock signal to the digital logic circuitry in response to the signal indicative of current or power consumed by the system;
        the clock signal comprising the system clock signal when the signal indicative of current or power consumed by the system is in a first state comprising a predetermined level of said system current or power consumed by the system;
        the clock signal comprising a modified clock signal when the signal indicative of current or power consumed by the system is in a second state,
    wherein the predetermined level of system current or power consumed by the system is dynamically adaptable to vary the triggering condition of the modified clock signal in respect of the second state.

9. The digital circuit of claim 8, wherein the power supply monitor circuitry comprises a programmable current sink.

10. The digital circuit of claim 8, wherein the power supply monitor circuitry comprises a voltage comparator.

11. The digital circuit of claim 8, the clock regulation circuitry comprising a clock inhibiting circuitry, the clock inhibiting circuitry inhibiting the clock signal to the digital circuitry when the signal indicative of current or power consumed by the system is in the second state.

12. The digital circuit of claim 8, the clock regulation circuitry comprising a clock reduction circuitry, the clock reduction circuitry outputting a second clock signal to the digital circuitry when the first signal indicative of current or power consumed by the system is in the second state, the second clock signal being slower than the system clock signal.

13. A digital system powered by a system current, the digital system having a system clock signal, the system comprising:

a first logic circuitry clocked by a first clock signal;

a second logic circuitry clocked by a second clock signal;

the first and second logic circuitries powered by the system current;

an adaptive clocking circuit, communicatively coupled to the first logic circuitry, the system current, and to the system clock, the adaptive clocking circuit supplying the first clock signal;

the first clock signal being the system clock signal when the current consumed by the system is below a predetermined threshold;

the first clock signal being another clock signal when the current consumed by the system is above the predetermined threshold; and the adaptive clocking circuit being constructed and arranged to (i) vary said another clock signal and level of system current consumed by the first logic circuitry, independently of clock rate and system current consumption of the second logic circuitry, when the current consumed by the system is above the predetermined threshold, and (ii) dynamically speed up or slow down or inhibit the first logic circuitry, in relation to the second logic circuitry, to responsively adjust system current consumption of the first and second logic circuitries so that current consumed by the system does not breach a current consumption budget of the system.

14. The digital system of claim 13, the adaptive clocking circuit comprising a system current monitoring circuitry that produces a signal indicative of the current consumed by the system.

15. The digital system of claim 14, the system current monitoring circuitry comprising a capacitor.

16. The digital system of claim 14, wherein the system current monitoring circuitry is programmable.

17. The digital system of claim 14, the system current monitoring circuitry comprising a programmable current sink.

18. The digital system of claim 14, the system current monitoring circuitry comprising a voltage comparator.

19. The digital system of claim 14, the adaptive clocking circuit further comprising a clock generating circuitry, communicatively coupled to the system clock, that produces the first clock signal based on the signal indicative of the current consumed by the system.

20. The digital system of claim 19, wherein the another clock signal inhibits the operation of the first logic circuitry.

21. The digital system of claim 19, wherein the another clock signal operates at a slower speed than the system clock signal.

22. The digital system of claim 19, the adaptive clocking circuitry comprising a flip-flop.

23. The digital system of claim 19, the adaptive clocking circuitry comprising a clock divider.

24. The digital system of claim 13, wherein the adaptive clocking circuit is communicatively coupled to the second logic circuitry and arranged to supply the second clock signal to the second logic circuitry.

25. A method of altering a clock signal to a digital circuitry in a system based upon a current supplied to the system, the system running on a system clock, the method comprising:

monitoring the current against a first predetermined current level;

selectively clocking the digital circuitry based on the current, the step of selectively clocking comprising:

generating a first clock if the step of monitoring indicates that the current is below the first predetermined level;

generating a second clock if the step of monitoring indicates that the current is above the first predetermined level; and continuously varying the second clock in accordance with level of current consumed by the digital circuitry in relation to the current supplied to the system when the current supplied to the system is above the first predetermined level, and dynamically speeding up or slowing down the digital circuitry or inhibiting clock rate so that the digital circuitry runs at a clock rate that does not breach a total current consumption budget of the system.

26. The method of claim 25 further comprising dynamically adapting the predetermined level.

27. The method of claim 26 wherein the step of dynamically adapting is performed, at least in part, by a circuit comprising a current sink.

28. The method of claim 25 wherein the step of monitoring is performed by a circuit comprising a capacitor.

29. The method of claim 25 wherein the step of monitoring is performed by a circuit comprising a voltage comparator.

30. The method of claim 25, the step of generating a second clock comprising inhibiting the clock to the digital circuitry.

31. The method of claim 25 wherein the first clock is the system clock.

32. The method of claim 25 wherein the second clock is slower than the system clock.

33. The method of claim 25, the step of monitoring comprising monitoring the current to exceed a second predetermined current.

34. The method of claim 33, the step of selectively clocking further comprising generating a third clock if the step of monitoring indicates that the current is above the second predetermined level.

35. The method of claim 34 wherein the first clock is the system clock.

36. The method of claim 34 wherein the second clock is slower than the system clock.

37. The method of claim 36, the step of generating a third clock comprising inhibiting the clock to the digital circuitry.

38. The method of claim 36 wherein the third clock is slower than the second clock.

* * * * *